(12) United States Patent
Duan et al.

(10) Patent No.: US 11,054,707 B2
(45) Date of Patent: Jul. 6, 2021

(54) METHOD OF MANUFACTURING VIA HOLE, METHOD OF MANUFACTURING ARRAY SUBSTRATE, AND ARRAY SUBSTRATE

(71) Applicants: BOE Technology Group Co., Ltd., Beijing (CN); Hefei BOE Optoelectronics Technology Co., Ltd., Hefei (CN)

(72) Inventors: Xianxue Duan, Beijing (CN); Kui Gong, Beijing (CN)

(73) Assignees: BOE Technology Group Co., Ltd., Beijing (CN); Hefei BOE Optoelectronics Technology Co., Ltd., Anhui (CN)

(*) Notice: Subject to any disclaimer, the term of this patent is extended or adjusted under 35 U.S.C. 154(b) by 565 days.

(21) Appl. No.: 15/774,576

(22) PCT Filed: Oct. 9, 2017

(86) PCT No.: PCT/CN2017/105380
§ 371 (c)(1),
(2) Date: May 8, 2018

(87) PCT Pub. No.: WO2018/157601
PCT Pub. Date: Sep. 7, 2018

(65) Prior Publication Data
US 2020/0285124 A1 Sep. 10, 2020

(30) Foreign Application Priority Data
Mar. 1, 2017 (CN) .......................... 201710117979.4

(51) Int. Cl.
G02F 1/1362 (2006.01)
H01L 21/02 (2006.01)
(Continued)

(52) U.S. Cl.
CPC ...... G02F 1/136227 (2013.01); G02F 1/1368 (2013.01); G02F 1/13439 (2013.01);
(Continued)

(58) Field of Classification Search
None
See application file for complete search history.

(56) References Cited

U.S. PATENT DOCUMENTS 5,350,484 A * 9/1994 Gardner ............ H01L 21/32136
257/E21.311
6,001,745 A * 12/1999 Tu ..................... H01L 21/76802
257/E21.577
(Continued)

FOREIGN PATENT DOCUMENTS

CN 101388413 A 3/2009
CN 103489757 A 1/2014
(Continued)

OTHER PUBLICATIONS

Jan. 15, 2018—(WO) International Search Report and Written Opinion Appn PCT/CN2017/105380 with English Tran.

*Primary Examiner* — Angel Roman
(74) *Attorney, Agent, or Firm* — Banner & Witcoff, Ltd.

(57) ABSTRACT

A method of manufacturing a via hole, a method of manufacturing an array substrate and an array substrate are provided. The method of manufacturing an via hole includes: providing a base substrate; forming an insulation layer on the base substrate; etching the insulation layer by using a first etching process to form a groove in the insulation layer; performing an ion implantation process with ions on a portion of the insulation layer exposed by the groove to form an ion implantation region; and etching a portion of the
(Continued)

insulation layer in the ion implantation region by using a second etching process to form a via hole penetrating the insulation layer.

14 Claims, 4 Drawing Sheets

(51) Int. Cl.
    *H01L 21/311*    (2006.01)
    *H01L 21/3115*   (2006.01)
    *H01L 21/027*    (2006.01)
    *H01L 27/12*     (2006.01)
    *G02F 1/1368*   (2006.01)
    *G02F 1/1343*   (2006.01)

(52) U.S. Cl.
    CPC ...... *H01L 21/0217* (2013.01); *H01L 21/0273* (2013.01); *H01L 21/31116* (2013.01); *H01L 21/31144* (2013.01); *H01L 21/31155* (2013.01); *H01L 27/1262* (2013.01); *H01L 27/1288* (2013.01)

(56) References Cited

U.S. PATENT DOCUMENTS

| | | | |
|---|---|---|---|
| 6,326,300 B1* | 12/2001 | Liu | H01L 21/31116 |
| | | | 257/E21.248 |
| 6,514,844 B1* | 2/2003 | Martin | H01L 21/31155 |
| | | | 257/E21.248 |
| 2003/0124863 A1 | 7/2003 | Hwang et al. | |
| 2008/0116794 A1 | 5/2008 | Cho et al. | |
| 2011/0312171 A1* | 12/2011 | Lim | H01L 21/28114 |
| | | | 438/587 |
| 2013/0189825 A1* | 7/2013 | Le Tiec | H01L 21/31155 |
| | | | 438/400 |
| 2017/0162606 A1* | 6/2017 | Yan | H01L 29/78648 |

FOREIGN PATENT DOCUMENTS

| | | |
|---|---|---|
| CN | 105097839 A | 11/2015 |
| CN | 106707649 A | 5/2017 |

\* cited by examiner

FIG. 4c

METHOD OF MANUFACTURING VIA HOLE, METHOD OF MANUFACTURING ARRAY SUBSTRATE, AND ARRAY SUBSTRATE

The application is a U.S. National Phase Entry of International Application No. PCT/CN2017/105380 filed on Oct. 9, 2017, designating the United States of America and claiming priority to Chinese Patent Application No. 201710117979.4, filed on Mar. 1, 2017. The present application claims priority to and the benefit of the above-identified applications and the above-identified applications are incorporated by reference herein in their entirety.

TECHNICAL FIELD

At least one embodiment of the present disclosure relates to a method of manufacturing a via hole, a method of manufacturing an array substrate, and an array substrate.

BACKGROUND

For a flat display device such as a liquid crystal display (LCD), a quality of a display substrate is very important. In a method of manufacturing a display substrate, an insulation layer needs to be deposited on a display substrate on which a thin film transistor has been formed. A dry etching process is performed on the insulation layer to form a via hole, and then a pixel electrode is formed on the insulation layer. The pixel electrode can be electrically connected with the thin film transistor through the via hole to achieve data transmission.

In a process of manufacturing a conventional display substrate, the insulation layer has a structure including multiple insulation sub-layers with different etching rates. The etching rate of the bottommost insulation sub-layer is greater than the etching rate of the insulation sub-layer directly there-above, resulting in that the bottommost insulation sub-layer is etched too quickly and the via hole is formed with an internally stepped barbed angle at a bottom of the insulation layer to produce an undesirable undercut. The undercut causes a break of contact between the pixel electrode and a source-drain electrode layer of the thin film transistor, thereby resulting in an abnormal display or failed display of a display device, and reducing the quality and yield of the display device.

SUMMARY

At least one embodiment of the present disclosure provides a method of manufacturing a via hole, including: providing a base substrate; forming an insulation layer on the base substrate; etching the insulation layer by using a first etching process to form a groove in the insulating layer; performing an ion implantation process on a portion of the insulation layer exposed by the groove to form an ion implantation region; etching a portion of the insulation layer in the ion implantation region by using a second etching process to form a via hole penetrating the insulation layer.

At least one embodiment of the present disclosure provides a method of manufacturing an array substrate, including the method of manufacturing the via hole as mentioned above.

At least one embodiment of the present disclosure provides an array substrate, including: a base substrate; an insulation layer disposed on the base substrate; and a via hole penetrating the insulation layer. The insulation layer includes a first insulation sub-layer and a second insulation sub-layer sequentially located on the base substrate; the first insulation sub-layer includes a first portion close to the via hole and a second portion far away from the via hole; and a density of the first portion is greater than that of the second portion.

At least one embodiment of the present disclosure provides a method of manufacturing a via hole, a method of manufacturing an array substrate, and an array substrate. The method of manufacturing the via hole utilizes an ion implantation process to perform ion implantation on the insulation layer to increase the density of the portion of the insulation layer in the ion implantation region so as to avoid a several lateral etching which may result in an undercut chamfer, thereby improving the quality of the via hole, guaranteeing the effectiveness of the via hole, mitigating or eliminating the unfavorable phenomenon in which the contact between the pixel electrode and the source-drain electrode layer for electrical connection using the via hole is broken, enhancing a stability of an electrical connection between the pixel electrode and the source/drain electrode layer, and advancing the quality and yield of the product.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

The various features or structures in the drawings are not necessarily drawn to scale, and for the sake of clarity, the dimensions of respective components or structures may be exaggerated or reduced, such as increasing the thickness of the layers, the width of the electrodes, etc., but these should not be used to limit the scope of the disclosure. In order to keep the following description of the embodiments of the present disclosure clear and concise, detailed descriptions of known functions and known components are omitted in the present disclosure.

Figure 1:
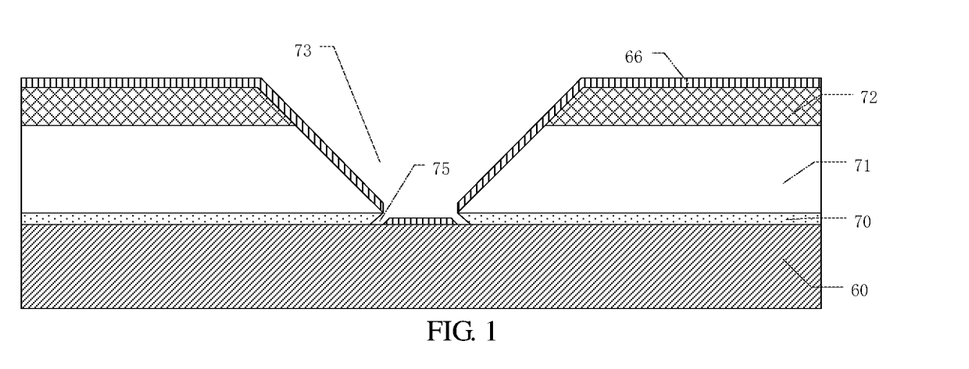
FIG. 1 is a schematic view illustrating a structure of a via hole in an insulation layer.

FIG. 1 is a schematic view illustrating a structure of a via hole in an insulation layer.

At present, in the process of manufacturing an array substrate, an insulation layer needs to be deposited on a thin film transistor, and then a dry etching method is utilized to form a via hole in the insulation layer. Finally, a pixel electrode is formed on a surface of the insulation layer to be electrically connected with a source electrode or a drain electrode of the thin film transistor through the via hole. As illustrated in FIG. 1, an insulation layer and a pixel electrode 66 are sequentially disposed on the base substrate 60. The insulation layer includes a via hole 73 penetrating the insulation layer, and the pixel electrode 66 can be electrically connected with a source/drain electrode layer (not illustrated) disposed on the base substrate 60 through the via hole 73. In a direction perpendicular to the base substrate 60, the insulation layer can include a transition layer 70, a main body layer 71, and a top layer 72. Generally, an etching rate of the transition layer 70 is higher than that of the main body layer 71 and that of the top layer 72. When etching the transition layer 70, because the etching rate thereof is greater than that of the main body layer 71, a lateral etching may be occurred in the transition layer 70 and the via hole 73 may be formed with an internally stepped barbed angle 75 at a bottom of the transition layer 70 to produce an unfavorable undercut, which may cause the pixel electrode 66 to be broken at the barbed angle 75 so that the contact between the pixel electrode 66 and the source-drain electrode layer is broken, resulting in abnormal display or failed display, and reducing the product yield and decreasing the product quality.

At least one embodiment of the present disclosure provides a method of manufacturing a via hole, a method of manufacturing an array substrate, and an array substrate. The method of manufacturing the via hole includes: providing a base substrate; forming an insulation layer on the base substrate; etching the insulation layer by using a first etching process to form a groove in the insulation layer; performing an ion implantation process on a portion of the insulation layer exposed by the groove to form an ion implantation region; etching a portion of the insulation layer in the ion implantation region by using a second etching process to form a via hole penetrating the insulation layer.

The method of manufacturing the via hole utilizes an ion implantation process to perform ion implantation on the insulation layer to increase the density of the portion of the insulation layer in the ion implantation region so as to avoid a severe lateral etching which may generate an undercut chamfer, thereby improving the quality of the via hole, guaranteeing the effectiveness of the via hole, mitigating or eliminating the unfavorable phenomenon in which the contact between the pixel electrode and the source/drain electrode layer for electrical connection through the via hole is broken, enhancing the stability of the electrical connection between the pixel electrode and the source/drain electrode layer, and advancing the yield and the quality of the product.

Several embodiments of the present disclosure will be described in detail below, but the present disclosure is not limited to these specific embodiments.

Figure 2:
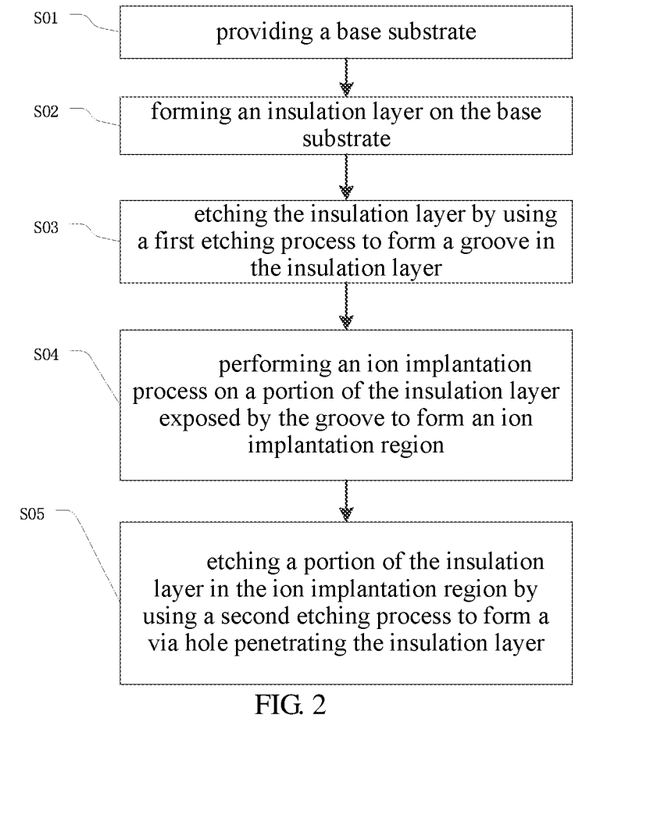
FIG. 2 is a flow chart illustrating a method of manufacturing a via hole according to an embodiment of the present disclosure.

At least one embodiment of the present disclosure provides a method of manufacturing a via hole. FIG. 2 illustrates a flow chart illustrating a method of manufacturing a via hole provided by an embodiment of the present disclosure, and FIGS. 3a-3f illustrate process diagrams illustrating a method of manufacturing a via hole provided by an embodiment of the disclosure. FIGS. 3a-3f illustrate only a portion of the relevant structure for clarity of explanation.

For example, as illustrated in FIG. 2, a method of manufacturing a via hole provided in the embodiments of the present disclosure includes the following steps:

S01: providing a base substrate;

S02: forming an insulation layer on the base substrate;

S03: etching the insulation layer by a first etching process to form a groove in the insulation layer;

S04: performing an ion implantation process on a portion of the insulation layer exposed by the groove to form an ion implantation region.

S05: etching a portion of the insulation layer in the ion implantation region by a second etching process to form a via hole penetrating the insulation layer.

The method of manufacturing the via hole utilizes an ion implantation process to perform ion implantation on the insulation layer to increase the density of the portion of the insulation layer in the ion implantation region so as to avoid a severe lateral etching which may generate an undercut chamfer, thereby improving the quality of the via hole and guaranteeing the effectiveness of the via hole.

The process of the method of manufacturing a via hole provided by the embodiment of the present disclosure will be described in more details below with reference to FIGS. 3a to 3f.

Figure 3A:
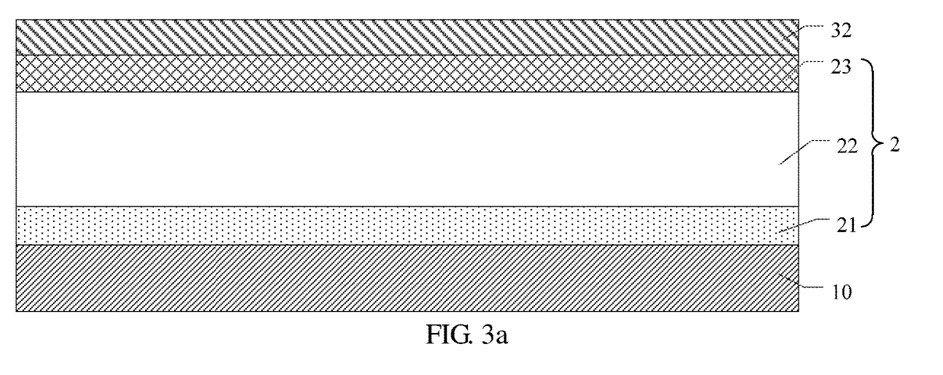
FIGS. 3a-3f are process diagrams illustrating a method of manufacturing a via hole according to an embodiment of the present disclosure.

For example, as illustrated in FIG. 3a, providing a base substrate 10, depositing an insulation layer 2 on the base substrate 10, and coating a layer of photoresist 32 on the insulation layer 2.

For example, depositing the insulation layer 2 can include depositing a first insulation sub-layer 21, a second insulation sub-layer 22, and a third insulation sub-layer 23 on the base substrate 10 in sequence. For example, deposition process parameters for depositing the insulation layer 2 can be controlled so that the first insulation sub-layer 21, the second insulation sub-layer 22, and the third insulation sub-layer 23 have different densities. For example, the deposition process parameters can include power, deposition time, or gas flow rate, etc. . . . For example, when the power and the gas flow rate are small and the deposition time is short, the density of the insulation layer as formed is also small. For example, a density of the first insulation sub-layer 21 can be smaller than that of the second insulation sub-layer 22.

For example, the base substrate 10 can be a metal substrate or a non-metal substrate. For example, the non-metal substrate can be a glass substrate, a quartz substrate, a ceramic substrate, a plastic substrate, a silicone substrate, or the like; and the non-metal substrate can also be a panel formed with functional components such as a liquid crystal display (LCD) panel, an organic light-emitting diode (OLED) display panel, or the like. For example, the metal substrate can be an electrogalvanized steel sheet, a hot dip galvanized steel sheet, an aluminized zinc steel sheet, or a red copper plate.

For example, the photoresist 32 can be coated by using a spin coating method, a blade coating method, a roll coating method or the like.

For example, the insulation layer 2 can be deposited by using a chemical vapor deposition (CVD) method, such as a plasma-enhanced chemical vapor deposition (PECVD) method, a low-pressure chemical vapor deposition (LPCVD) method, and the like; and the insulation layer 2 can also be deposited by using a physical vapor deposition (PVD) method or the like.

For example, a material of the insulation layer 2 can be silicon nitride (SiNx) or other suitable materials.

Figure 3B:
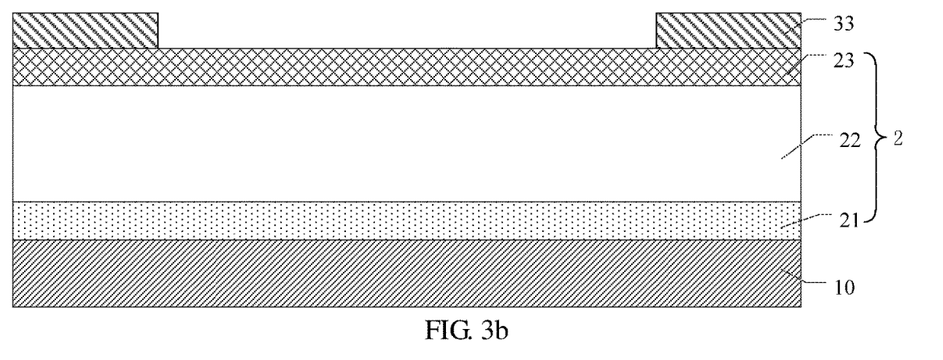

For example, as illustrated in FIG. 3b, exposing and developing the photoresist coated on the insulation layer 2 to form a photoresist pattern 33.

Figure 3C:
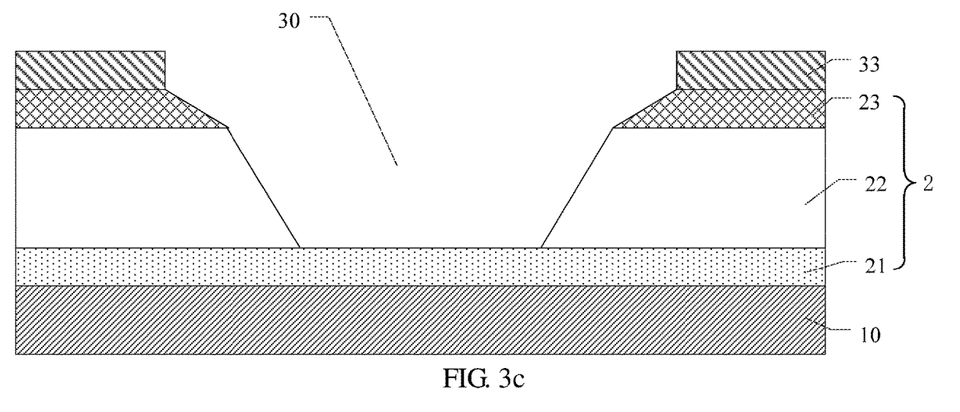

For example, as illustrated in FIG. 3c, by using the photoresist pattern 33 as an etching mask, performing a first etching process on the insulation layer 2 to form a groove 30 in the insulation layer 2.

For example, the first etching process can use a dry etching method. For example, the dry etching method can be a reaction ion etching (RIE) method, an ion beam etching (IBE) method, an inductively coupled plasma (ICP) etching method or the like. For example, the first etching process can be performed by using the ICP etching method. The ICP etching method has characteristics of small direct-current (DC) bias damage, high etching rate, controllable ion density and ion energy, and the like, which can shorten the etching time and can also accurately control an etched topography.

For example, in an example, the first etching process can adopt an ICP etching technique with a mixed gas of $SF_6$ and $O_2$ as an etching gas. The etching rate with $SF_6$ and $O_2$ is faster, which can shorten the production time. In addition, $SF_6$ and $O_2$ can react with the insulation layer to generate volatile gas. The volatile gas can be discharged by a vacuum system in time, so that residual foreign substances generated during the etching process can be promptly removed and will not affect a subsequent etching process; and at the same time, it can also ensure that the insulation layer is not contaminated by the residual foreign substances. For example, by adjusting the etching parameters, a sidewall of the groove 30 can be made smooth with a gentle slope. The etching parameters can be a working pressure and a power of the ICP etching apparatus, a flow rate and a composition ratio of the etching gas, and the like.

For example, the first etching process can adopt etching parameters in a conventional etching process. For example, an upper electrode power can be 7200-8800 W, a lower electrode power can be 1800-2200 W, a pressure value can be 900-1100 mT, a gas flow rate of $SF_6$ can be 1000-1400 Sccm, and a gas flow rate of 02 can be 1200-1700 Sccm. For example, in an embodiment of the present disclosure, regarding the etching parameters, the upper electrode power is 8000 W, the lower electrode power is 2000 W, the pressure value is 1000 mT, the gas flow rate of $SF_6$ is 1200 sccm, and the gas flow rate of $O_2$ is 1500 sccm.

For example, the density of the third insulation sub-layer 23 can also be smaller than that of the second insulation sub-layer 22, so that when the active plasma is used for etching, the third insulation sub-layer 23 with a relative small dense is more likely to allow the plasma to enter so as to achieve the etching purpose. On the other hand, the third insulation sub-layer 23 can also serve as an etching buffer layer. Because the density of the third insulation sub-layer 23 is smaller than that of the second insulation sub-layer 22, the etching rate of the third insulation sub-layer 23 is greater than that of the second insulation sub-layer 22, and a lateral etching ratio of the third insulation sub-layer 23 is also greater than that of the second insulation sub-layer 22. In a direction perpendicular to the base substrate 10, the groove 30 can include a portion far away from the base substrate 10 and a portion close to the base substrate 10, and an aperture of the portion of the groove 30 far away from the base substrate 10 is larger than that of the portion close to the base substrate 10. That is, the groove 30 can be formed into an inverted trapezoidal shape so that the groove 30 has a certain, gentle, slope angle. For example, the portion far away from the base substrate 10 can be a portion of the groove 30 located in the third insulation sub-layer 23, and the portion close to the base substrate 10 can be a portion of the groove 30 located in the second insulation sub-layer 22.

For example, during etching the insulation layer 2 by the first etching process, the third insulation sub-layer 23 and the second insulation sub-layer 22 are sequentially etched, and the first etching process is stopped at the moment when the first insulation sub-layer 21 is to be etched, thereby forming a groove 30 penetrating the second insulation sub-layer 22 and the third insulation sub-layer 23, with the first insulation sub-layer 21 being exposed by the groove 30.

For example, the etching process can be monitored in real time by using an etch endpoint detector (EPD) of an ICP device. After the third insulation sub-layer 23 and the second insulation sub-layer 22 are completely etched, the etch endpoint detector (EPD) automatically controls the ICP device to stop etching. For example, the etch endpoint detector (EPD) can detect parameters such as a refractive index of the insulation layer 2. The first insulation sub-layer 21, the second insulation sub-layer 22, and the third insulation sub-layer 23 have different densities, and hence have different refractive indexes. For example, before etching, the refractive index of the first insulation sub-layer 21 can be input into the etch endpoint detector (EPD) which automatically controls the ICE device to stop etching when it detects a refractive index of the material being etched is the same as that of the first insulation sub-layer 21. It should be noted that, an etch endpoint can also be monitored by other methods (for example, by detecting an etching depth) so as to control the ICP device to stop etching. The embodiments of the disclosure are not limited thereto.

Figure 3D:
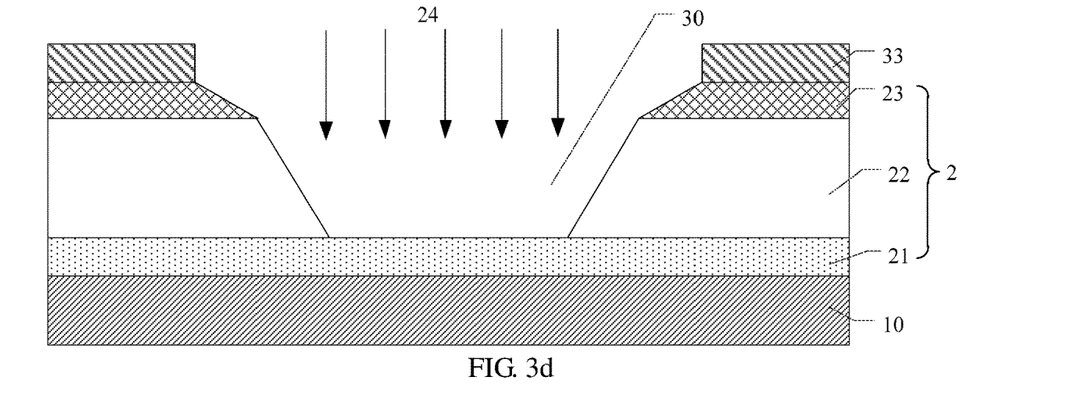
Figure 3E:
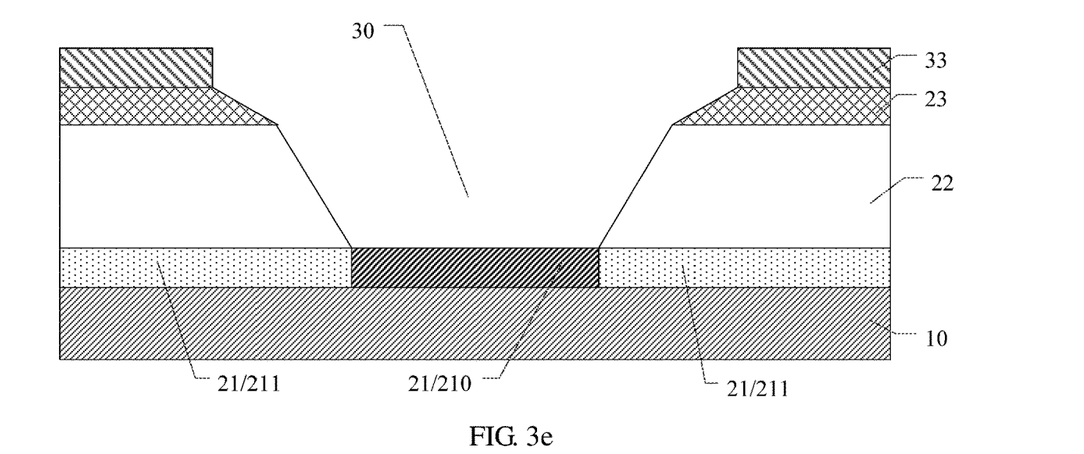

For example, as illustrated in FIGS. 3d-3e, by using the photoresist pattern 33 as a mask, performing an ion implantation process with ions 24 on a portion of the first insulation sub-layer 21 exposed by the groove 30 to form an ion implantation region.

Figure 3F:
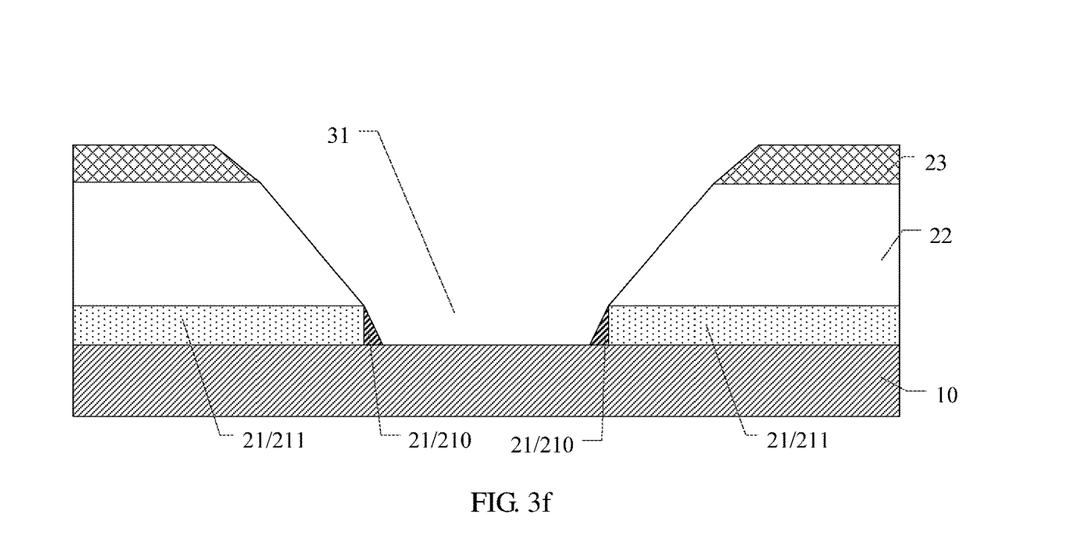

For example, as illustrated in FIG. 3f, still by using the photoresist pattern 33 as an etching mask, performing a second etching process on the insulation layer formed with the ion implantation region, and then removing the remaining photoresist by using a lift-off process so as to form a via hole 31 penetrating the insulation layer in the insulation layer.

For example, after the ions 24 are implanted, the first insulation sub-layer 21 can include a first portion 210 in the ion implantation region and a second portion 211 outside the ion implantation region. After the ions 24 are implanted, a density of the first portion 210 can be greater than that of the second portion 211. Because the density of the first portion 210 increases, the insulation layer becomes denser, the etching rate of the first portion 210 can be slowed down, thereby avoiding or reducing an over-reaction of the first portion 210 with reactive fluorine (F) ions; the over-reaction may cause excessive etching in a direction towards both sides and generate an undercut chamfer. On the other hand, the increased density of the first portion 210 allows the via hole 31 to form a gentle slope at an interface between the second insulation sub-layer 22 and the first insulation sub-layer 21.

For example, after the ions 24 are implanted, the density of the first portion 210 can also be greater than that of the second insulation sub-layer 22. Therefore, the etching rate of the first portion 210 is smaller than that of the second insulation sub-layer 22, thereby further preventing from lateral etching of the first portion 210, improving the quality of the via hole 31, and ensuring the effectiveness of the via hole 31.

For example, after the ions 24 are implanted, the density of the first portion 210 is increased, and the etching rate is slowed down. Thus, when the second etching process is performed, for example, the first portion 210 can be not completely etched but can be partly retained after the via hole 31 is formed.

For example, the ions 24 can be nitrogen ions, oxygen ions, or other suitable ions. When the ions 24 are nitrogen ions, under a plasma condition, nitrogen ($N_2$) gas is introduced into a surface of the exposed first insulation sub-layer 21 to obtain N ions which are controlled to be in direct contact with the first insulation sub-layer 21. The N ions are implanted into the first insulation sub-layer 21 under high temperature and high pressure so as to replace part of silicon (Si) ions; or, the N ions and a part of free Si ions are combined to form Si—N bonds, so that a part of or all of Si—Si bonds remaining in the original silicon-rich silicon nitride are replaced by the Si—N bonds. Because the Si—N bond has a shorter bond length but higher bond energy as compared with the Si—Si bond, the increased Si—N bond content can promote the first insulation sub-layer 21 to be tighter and improve the denseness of the first insulation sub-layer 21. In addition, the Si—Si bond in the silicon nitride is one of main factors causing defects in a silicon nitride film, as a result, by implanting N ions into the first insulation sub-layer 21 exposed by the groove 30, the density of the first insulation sub-layer 21 in the implantation region can be increased to some extent, an etching resistance of the first insulation sub-layer 21 in the ion implantation region with respect to fluorine (F) ion is improved, so that the etching rate is slowed down, which prevents the first insulation sub-layer 21 from being severely laterally etched to produce an undercut chamfer. After the N ions are implanted into the insulation layer, the first insulation sub-layer 21 exposed by the groove 30 becomes the first portion 210 with higher density, while the density of the second portion 211 with no N ion implanted remains unchanged.

For example, the second etching process can be performed by using the same etching techniques and the same etching parameters as that of the first etching process. For example, the second etching process can be performed by using an ICP etching technology. The second etching process can also be performed by using different etching techniques and different etching parameters from that of the first etching process. For example, the second etching process can be performed by using an IBE etching technique.

It should be noted that the first etching process and the second etching process can also use other suitable etching equipments and other suitable etching gases (for example, using a mixed gas of $CF_4$ and $O_2$ as an etching gas). The embodiments of the disclosure are not limited herein.

Figure 4A:
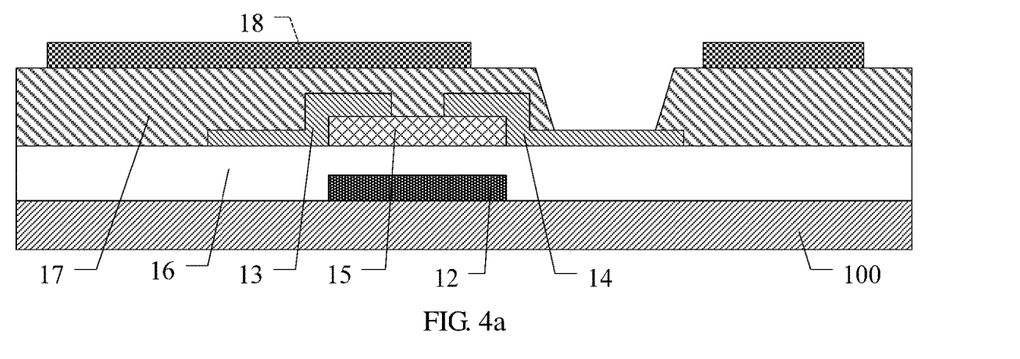
FIGS. 4a-4c are process diagrams illustrating a method of manufacturing an array substrate according to an embodiment of the present disclosure.
Figure 4B:
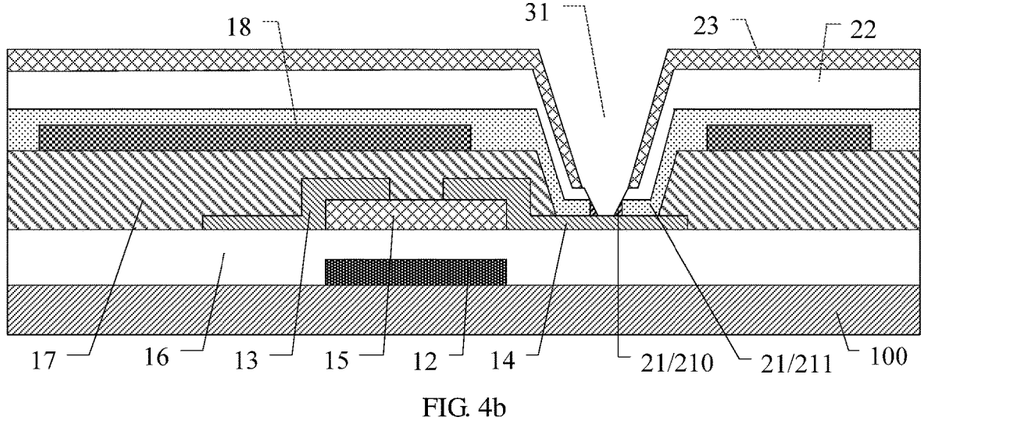
Figure 4C:
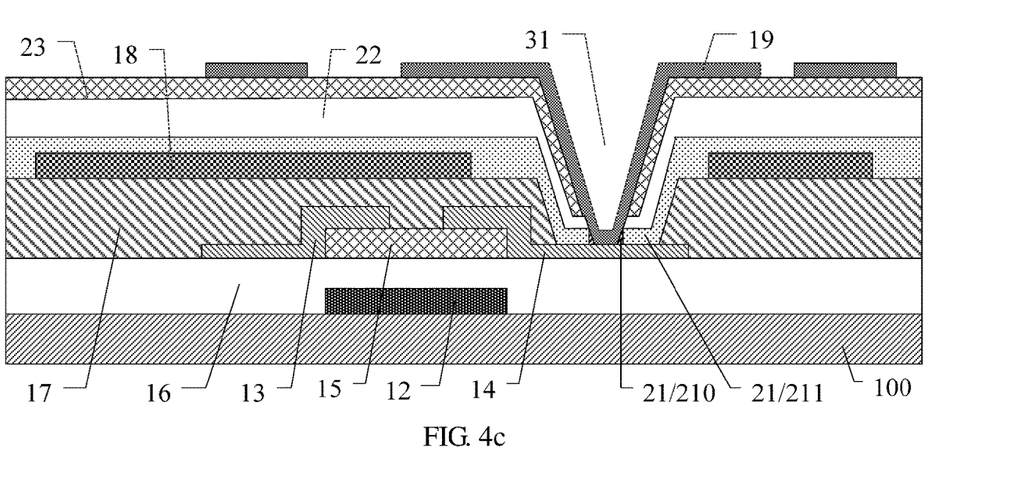

FIGS. 4a-4c are process diagrams illustrating a method of manufacturing an array substrate provided by an embodiment of the present disclosure. FIGS. 4a-4c still illustrate only a portion of the relevant structure for more clarity of explanation.

The embodiments of the present disclosure further provide a method of manufacturing an array substrate. The method of manufacturing the array substrate of the embodiments of the present disclosure can include the method of manufacturing the via hole in the above embodiments.

For example, as illustrated in FIG. 4a, a base substrate 100 is provided, and a gate electrode 12, a gate insulation layer 16, an active layer 15, a source/drain electrode layer, a passivation layer 17 and a common electrode 18 are sequentially formed on the base substrate 100 by a patterning process.

For example, the base substrate 100 can be a transparent insulation substrate. For example, the base substrate 100 can be a glass substrate, a quartz substrate, a plastic substrate, or other suitable substrates.

For example, the source/drain electrode layer can include a first electrode 13 and a second electrode 14. For example, the first electrode 13 can be a source electrode or a drain electrode, and accordingly the second electrode 14 can be a drain electrode or a source electrode. For example, the first electrode 13, the active layer 15, the second electrode 14, the gate electrode 12, and the gate insulation layer 16 constitute a thin film transistor, which can serve as a switching element of a pixel region of the array substrate.

For example, a material of the first electrode 13 and the second electrode 14 can include a copper-based metal, an aluminum-based metal, a nickel-based metal, or the like. For example, the copper-based metal can be a copper-based metal alloy with stable performance such as copper (Cu), copper-zinc alloy (CuZn), copper-nickel alloy (CuNi), or copper-zinc-nickel alloy (CuZnNi). The copper-based metal has the characteristics of low resistivity and good conductivity, so that a signal transmission rate of the source electrode and the drain electrode can be increased and the display quality can be improved.

For example, a material of the gate electrode 12 can be copper (Cu) and copper-molybdenum alloy (Cu/Mo); or can be a chromium-based metal such as chromium-molybdenum alloy (Cr/Mo) and chromium-titanium (Cr/Ti); or can be aluminum, aluminum alloy or other suitable materials.

For example, the active layer 15 can be an amorphous silicon layer, a polysilicon layer, or a metal oxide semiconductor layer. For example, the polysilicon can be high-temperature polysilicon or low-temperature polysilicon, and the oxide semiconductor can be indium gallium zinc oxide (IGZO), indium zinc oxide (IZO), zinc oxide (ZnO), or gallium zinc oxide (GZO).

For example, a material of the common electrode 18 can be a transparent conductive material, a metal material, or other suitable materials, such as indium tin oxide (ITO), indium zinc oxide (IZO), indium gallium oxide (IGO), gallium zinc oxide (GZO), or carbon nanotubes and so on.

For example, the common electrode 18 can be a plate electrode or a slit electrode.

For example, a material of the gate insulation layer 16 and the passivation layer 17 can include silicon nitride (SiNx), silicon oxide (SiOx), silicon oxynitride (SiNxOy), or other suitable materials such as an organic resin material. For example, the gate insulation layer 16 and the passivation layer 17 can have a single layer structure or a multilayer structure composed of one or more of the above materials.

For example, as illustrated in FIG. 4b, an insulation layer is deposited on the common electrode 18, and then a via hole 31 penetrating the insulation layer is formed by a patterning process. The common electrode 18 is in direct contact with the insulation layer.

For example, depositing the insulation layer includes sequentially depositing a first insulation sub-layer 21, a second insulation sub-layer 22, and a third insulation sub-layer 23 on the common electrode 18. For example, the common electrode 18 can be in direct contact with the first insulation sub-layer 21.

For example, by controlling deposition process parameters, the density of the first insulation sub-layer 21 is smaller than that of the second insulation sub-layer 22. The second insulation sub-layer 22 with relatively large density is rich in silane, so that a concentration of hydrogen (1-1±) radicals in the second insulation sub-layer 22 is relatively higher. The hydrogen (1-1±) radicals are easy to cause a reduction reaction of metal ions in the common electrode 18 to generate an opaque metal or a metal composition, which results in black spots formed in the common electrode 18. On the other hand, the high concentration of hydrogen (1-1±) radicals also provides a strong trapping capability for the oxygen ions in the common electrode 18, thereby affecting the properties of the common electrode 18 and reducing the display quality. The first insulation sub-layer 21 can prevent the second insulation sub-layer 22 with a relative large density from being in direct contact with the common electrode 18, thereby reducing or eliminating metal black spots and improving the display quality.

For example, the via hole 31 can be manufactured by using the method of manufacturing the via hole as described in the above embodiments, so that the via hole 31 is not formed with an undercut chamfer, the quality of the via hole 31 is improved, and the effectiveness of the via hole 31 is ensured. For example, after the second etching process is performed, the first portion 210 of the first insulation sub-layer 21 can be partly retained.

For example, the first electrode 13 or the second electrode 14 in the source/drain electrode layer can be exposed by the via hole 31. As illustrated in FIG. 4b, in an example, the second electrode 14 in the source/drain electrode layer is exposed by the via hole 31.

For example, in the embodiment of the present disclosure, a material of the insulation layer can be silicon nitride; and the first insulation sub-layer 21, the second insulation sub-layer 22 and the third insulation sub-layer 23 are formed of silicon nitride having different densities. In addition to an insulation performance, the silicon nitride also has excellent ion isolation ability, so as to effectively prevent oxygen and moisture in the air from entering the array substrate and affecting the performance of the thin film transistor, thereby improving the quality and the product yield of the array substrate.

For example, as illustrated in FIG. 4c, the pixel electrode 19 is formed, by a patterning process, on the insulation layer formed with the via hole 31.

For example, the pixel electrode 19 can be electrically connected with the first electrode 13 or the second electrode 14 through the via hole 31 so as to receive a data signal transmitted through the thin film transistor.

For example, a material of the pixel electrode 19 can include a transparent conductive material, a metal material, or other suitable materials. For example, the material of the pixel electrode 19 can be indium tin oxide (ITO), indium zinc oxide (IZO), or the like.

For example, the pixel electrode 19 can be a plate electrode or a slit electrode. For example, as illustrated in FIG. 4c, a plurality of branches that are parallel with each other and spaced apart from each other can be formed by a patterning process, so that a slit-shaped pixel electrode 19 is formed.

For example, the density of the third insulation sub-layer 23 can also be smaller than that of the second insulation sub-layer 22, so that the etching rate of the third insulation sub-layer 23 can be greater than that of the second insulation sub-layer 22, thereby forming a via hole 31 with a certain gentle slope angle when performing etching to form the via hole 31. The pixel electrode 19 can be smoothly connected with a side wall of the insulation layer to prevent the pixel electrode 19 from breaking at a step formed by the via hole 31 on a surface of the third insulation sub-layer 23, thereby improving the display quality and also the product yield.

It should be noted that, the method of manufacturing an array substrate provided by the embodiments of the present disclosure is described with reference to a bottom-gate type thin film transistor by way of example but is not limited thereto. The method of manufacturing an array substrate provided by the embodiments of the present disclosure can also be applied to a top-gate type thin film transistor.

The embodiments of the present disclosure further provide an array substrate.

For example, as illustrated in FIG. 4c, an array substrate provided by an embodiment of the present disclosure includes a base substrate 100 and an insulation layer disposed on the base substrate 100. The insulation layer includes a via hole 31.

For example, the insulation layer can include a first insulation sub-layer 21 and a second insulation sub-layer 22 sequentially disposed on the base substrate 100. The first insulation sub-layer 21 can include a first portion 210 close to the via hole 31 and a second portion 211 far away from the via hole 31. A density of the first portion 210 is greater than that of the second portion 211. The first portion 210 with relatively larger density can ensure that the via hole 31 is not formed with an internally stepped barbed angle, improve the quality of the via hole 31, and guarantee he effectiveness of the via hole 31.

For example, the density of the first portion 210 can also be greater than that of the second insulation sub-layer 22.

For example, the insulation layer can further include a third insulation sub-layer 23 disposed on the second insulation sub-layer 22, and a density of the third insulation sub-layer 23 can be smaller than that of the second insulation sub-layer 22.

For example, as illustrated in FIG. 4c, the array substrate further includes a gate electrode 12, a gate insulation layer 16, an active layer 15, a source/drain electrode layer (for example, the source/drain electrode layer can include a first electrode 13 and a second electrode 14), a passivation layer 17 and a common electrode 18 which are disposed between the base substrate 100 and the insulation layer.

For example, the common electrode 18 can be in direct contact with the first insulation sub-layer 21.

For example, the array substrate further includes a pixel electrode 19 located on the insulation layer. The pixel electrode 19 can be electrically connected with the first electrode 13 or the second electrode 14 through the via hole 31. The via hole 31 has a gentle slope angle and does not have an internally stepped barbed angle, so that an undesirable phenomenon in which the contact between the pixel electrode 19 and the source/drain electrode layer is broken can be mitigated or eliminated, thereby enhancing the stability of the electrical connection between the pixel electrode 19 and the source/drain electrode layer, improving the product yield and increasing the product quality.

For example, in the embodiments of the present disclosure, the pixel electrode 19 and the common electrode 18 are formed in different layers, so that the array substrate can be used, for example, in a liquid crystal panel with an advanced super dimension switching technology (ADS) mode. It should be noted that, the pixel electrode 19 and the common electrode 18 can also be formed in the same layer, which is not limited in the embodiments of the present disclosure.

For example, the array substrate can be applied to any products or components having a display function such as a liquid crystal panel, an electronic paper, an OLED panel, a mobile phone, a tablet computer, a television, a displayer, a notebook computer, a digital photo frame and a navigator.

With respect to the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thicknesses of layers or regions are enlarged or reduced, i.e., these drawings are not drawn to actual scale.

(3) In case of no conflict, features in one embodiment or in different embodiments can be combined.

The foregoing descriptions are merely specific embodiments of the present disclosure, but the scope of protection of the present disclosure is not limited thereto, and the protection scope of the present disclosure shall be subject to the protection scope of the claims.

What is claimed is:

1. A method of manufacturing a via hole, comprising:
providing a base substrate;
forming an insulation layer on the base substrate;
etching the insulation layer by using a first etching process to form a groove in the insulation layer;
performing an ion implantation process on a portion of the insulation layer exposed by the groove to form an ion implantation region; and
etching a portion of the insulation layer in the ion implantation region by using a second etching process to form a via hole penetrating the insulation layer,
wherein the forming the insulation layer on the base substrate comprises forming a first insulation sub-layer and a second insulation sub-layer sequentially on the base substrate, and wherein, before performing the ion implantation process, a density of the first insulation sub-layer is smaller than that of the second insulation sub-layer, and
wherein the forming the insulation layer further comprises forming a third insulation sub-layer on the second insulation sub-layer, wherein a density of the third insulation sub-layer is smaller than that of the second insulation sub-layer.

2. The method of manufacturing the via hole according to claim 1, wherein the etching the insulation layer by using the first etching process to form the groove in the insulation layer comprises:
etching the second insulation sub-layer until the first insulation sub-layer is exposed by the groove.

3. The method of manufacturing the via hole according to claim 2, wherein in the ion implantation process, performing the ion implantation process on a portion of the first insulation sub-layer exposed by the groove.

4. The method of manufacturing the via hole according to claim 3, wherein upon the ion implantation process being performed, a density of the portion of the first insulation sub-layer in the ion implantation region is increased.

5. The method of manufacturing the via hole according to claim 3, wherein upon the ion implantation process being performed, the density of the portion of the first insulation sub-layer in the ion implantation region is greater than that of the second insulation sub-layer.

6. The method of manufacturing the via hole according to claim 1, wherein the performing the ion implantation process comprises performing the ion implantation process with nitrogen ions or oxygen ions.

7. The method of manufacturing the via hole according to claim 1, wherein a material of the insulation layer is silicon nitride (SiNx).

8. The method of manufacturing the via hole according to claim 1, further comprising:
before performing the first etching process, coating a photoresist on the insulation layer, and exposing and developing the photoresist to form a photoresist pattern, wherein the first etching process is performed by using the photoresist pattern as a mask.

9. A method of manufacturing an array substrate, comprising manufacturing a via hole, comprising:
providing a base substrate;
forming an insulation layer on the base substrate;
etching the insulation layer by using a first etching process to form a groove in the insulation layer;
performing an ion implantation process on a portion of the insulation layer exposed by the groove to form an ion implantation region; and
etching a portion of the insulation layer in the ion implantation region by using a second etching process to form a via hole penetrating the insulation layer,
wherein the forming the insulation layer on the base substrate comprises forming a first insulation sub-layer and a second insulation sub-layer sequentially on the base substrate, and wherein, before performing the ion implantation process, a density of the first insulation sub-layer is smaller than that of the second insulation sub-layer, and
wherein the forming insulation layer further comprises forming a third insulation sub-layer on the second insulation sub-layer, wherein a density of the third insulation sub-layer is smaller than that of the second insulation sub-layer.

10. The method of manufacturing the array substrate according to claim 9, further comprising:
forming a gate electrode, a gate insulation layer, an active layer, a source/drain electrode layer, and a common electrode on the base substrate, wherein
the insulation layer is formed on the common electrode and is in direct contact with the common electrode, and
a source electrode or a drain electrode in the source/drain electrode layer is exposed by the via hole.

11. The method of manufacturing the array substrate according to claim 10, further comprising:
forming a pixel electrode on the insulation layer formed with the via hole, wherein the pixel electrode is electrically connected with the source electrode or the drain electrode through the via hole.

12. An array substrate, comprising:
a base substrate;
an insulation layer disposed on the base substrate; and
a via hole penetrating the insulation layer,
the insulation layer comprising a first insulation sub-layer and a second insulation sub-layer sequentially disposed on the base substrate, the first insulation sub-layer comprising a first portion close to the via hole and a second portion away from the via hole, and a density of the first portion being greater than that of the second portion, wherein the insulating layer further comprises a third insulation sub-layer disposed on the second insulation sub-layer, and wherein a density of the third insulation sub-layer is smaller than that of the second insulation sub-layer.

13. The array substrate according to claim 12, further comprising:

a gate electrode, a gate insulation layer, an active layer, a source/drain electrode layer, and a common electrode disposed between the base substrate and the insulation layer; and a pixel electrode disposed on the insulation layer, wherein the insulation layer is in direct contact with the common electrode, and the pixel electrode is electrically connected with a source electrode or a drain electrode in the source/drain electrode layer through the via hole.

14. The method of manufacturing the via hole according to claim 4, wherein upon the ion implantation process being performed, the density of the portion of the first insulation sub-layer in the ion implantation region is greater than that of the second insulation sub-layer.

* * * * *